Aug. 12, 1969 R. J. BARRY 3,461,324

SEMICONDUCTOR DEVICE EMPLOYING PUNCHTHROUGH

Filed July 3, 1967 2 Sheets-Sheet 1

INVENTOR.
ROBERT J. BARRY

BY David M. Keay

AGENT.

Aug. 12, 1969 R. J. BARRY 3,461,324

SEMICONDUCTOR DEVICE EMPLOYING PUNCHTHROUGH

Filed July 3, 1967 2 Sheets-Sheet 2

INVENTOR.
ROBERT J. BARRY

BY David M. Keay

AGENT.

United States Patent Office 3,461,324
Patented Aug. 12, 1969

3,461,324

SEMICONDUCTOR DEVICE EMPLOYING PUNCHTHROUGH

Robert J. Barry, Beverly, Mass., assignor to Sylvania Electric Products Inc., a corporation of Delaware Filed July 3, 1967, Ser. No. 650,991
Int. Cl. H01l 11/10
U.S. Cl. 307—305 7 Claims

ABSTRACT OF THE DISCLOSURE

Four-layer type semiconductor device having an additional region of the same conductivity type as one of the terminal regions adjacent the terminal region. Under reverse bias conditions punchthrough occurs from the terminal region to the additional region effectively increasing the size of the terminal region. Reverse bias operation of the device is thereby modified and improved electrical characteristics are obtained.

BACKGROUND OF THE INVENTION

This invention relates to semiconductor electrical translating devices. More particularly, it is concerned with semiconductor devices of the four-layer or PNPN type for high voltage A.C. operation.

One type of transistor device which has been employed in certain high voltage applications is a composite transistor of four layers of semiconductor material of alternating conductivity types in which the four layers, in effect, serve as the emitter, base, and collector regions of a complementary pair of transistors with their bases and collectors cross-connected. Electrical connections are made to the end or terminal regions of the device to provide anode and cathode connections, and a connection is made to one of the intermediate regions to provide an appropriate gate connection. This device is essentially a four-layer switching device of the so-called silicon rectifier type which is operated below its breakover voltage so as to remain in the switched "off" condition.

When the cathode and anode connections of the device are appropriately forward biased and the gate region is also forward biased, the device operates with the electrical characteristics of a high voltage transistor. When the anode and cathode are reversed biased, however, current amplification of the device is low. Thus, since the device does not have good electrical characteristics under both forward and reverse biasing conditions, the device does not provide efficient A.C. operation.

Various factors which contribute to good device characteristics in the device when it is forward biased adversely affect operation of the device when it is reverse biased. In a device in which the intermediate P-type layer, for example, is the gate region it is desirable that under forward biasing conditions the PNP transistor section constituted by the terminal P-type layer as the emitter, the intermediate N-type layer as the base, and the intermediate P-type layer as the collector have a low current amplification factor in order to provide a high breakover voltage. A low current amplification factor may be obtained by making the intermediate N-type layer wide and of high resistance and by making the terminal P-type region small so that its P-N junction area is small.

Under reverse bias conditions the terminal P-type layer becomes the collector region of the PNP transistor section and the intermediate P-type layer becomes the emitter region, and it is desirable for the PNP section to have a high current amplification factor. A high current amplification factor may be obtained by making the intermediate N-type layer narrow and of low resistance and by making the terminal P-type layer large so that its P-N junction is large. However, the intermediate N-type layer must be able to withstand the high voltage applied across the device. Thus, the elements of structure required for efficient operation of a device of this type under forward bias conditions conflict with those required for efficient operation under reverse bias conditions.

SUMMARY OF THE INVENTION

The semiconductor device according to the invention is of the general nature of a four-layer device. The device includes a body of semiconductor material having a first zone of one conductivity type with an ohmic connection to this zone. A second zone of the body which is intermediate the first zone and the remainder of the body is of the opposite conductivity type and an ohmic connection, which is the gate connection, is provided to this zone. A third zone of the body is of the one conductivity type and is intermediate the first and second zones and the remainder of the body. A fourth zone of the body is of the opposite conductivity type and is contiguous the third zone. An ohmic connection is provided to this fourth zone. In addition the body includes a fifth zone of the opposite conductivity type which is also contiguous the third zone. The fourth and fifth zones are arranged with respect to the second zone so that the shortest distance between the fourth zone and the fifth zone is less than the shortest distance between the fourth zone and the second zone and also less than the shortest distance between the fifth zone and the second zone.

When this device is operated under forward bias conditions, the first four zones produce transistor action as described above, and the fifth zone remains inactive. When the device is operated under reverse bias conditions, the space charge region of the fourth zone expands with increasing voltage into the third zone until it reaches the fifth zone. When the space charge region of the fourth zone touches the fifth zone, in effect the fourth zone becomes expanded to include all of the fourth and fifth zones and the space charge region encircling them thereby providing an enlarged P-N junction between the third and fourth zones. The fourth and fifth zones may advantageously be arranged around the second zone so as to effectively completely encircle it when the space charge region is expanded. Instead of a single fifth zone, several zones may be arranged around the second zone.

When the device is forward biased, the fourth zone which operates as an emitter is relatively small. Therefore the transistor section constituted by the second, third, and fourth zones provides low current amplification and contributes to a high value of breakover voltage. When the device is reverse biased, the fourth zone becomes the collector of the transistor section and as the applied voltage increases the collector is enlarged by the addition of the fifth zone. The ability of the collector to collect charge carriers emitted from the second zone is thereby greatly increased. That is, the current amplification factor of the transistor section and consequently of the device is greatly increased.

BRIEF DESCRIPTION OF THE DRAWINGS

Various objects, features, and advantages of semiconductor devices according to the invention will be apparent from the following detailed discussion and the accompanying drawings wherein.

In the figures various parts have not been drawn to scale. Certain dimensions are exaggerated in relation to other dimensions in order to present a clearer understanding of the invention.

DESCRIPTION OF THE PREFERRED EMBODIMENTS

Figures 1, 2, 5:
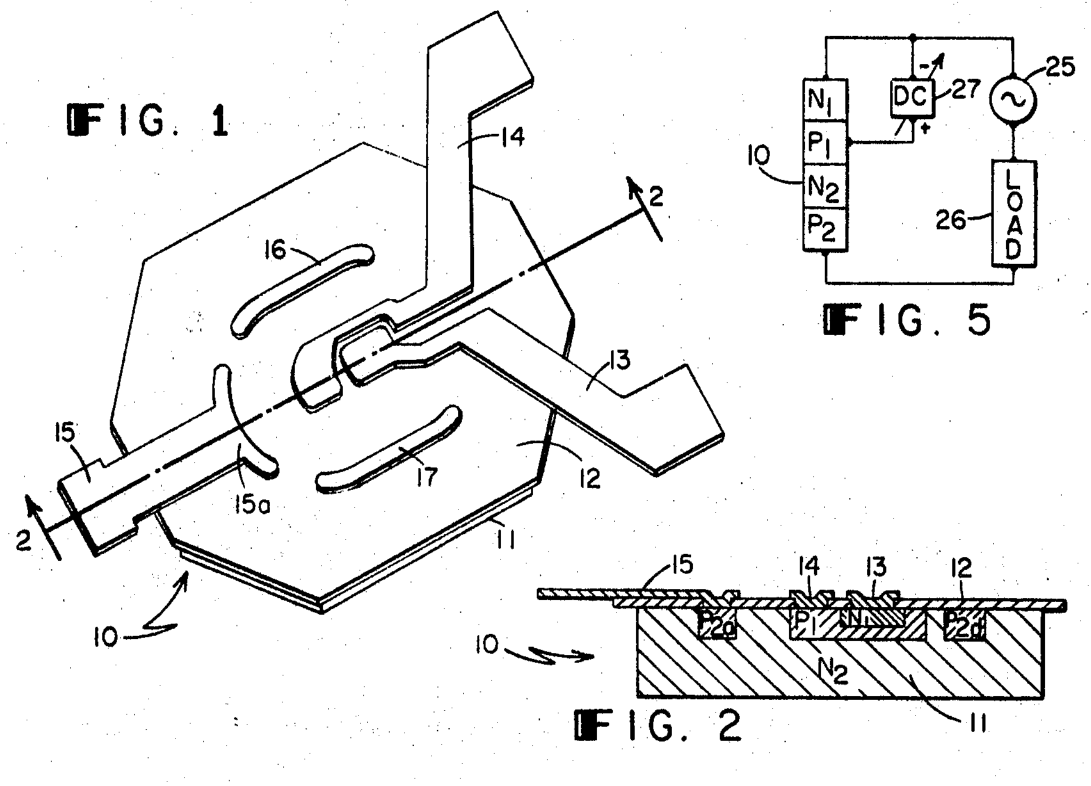
FIG. 1 is a perspective view of a semiconductor device according to the invention.
FIG. 2 is an elevational view of the device of FIG. 1 taken in cross-section along the line 2—2 of FIG. 1.
FIG. 5 is a circuit diagram of the device according to the invention connected to an A.C. source and a load.
Figure 3:
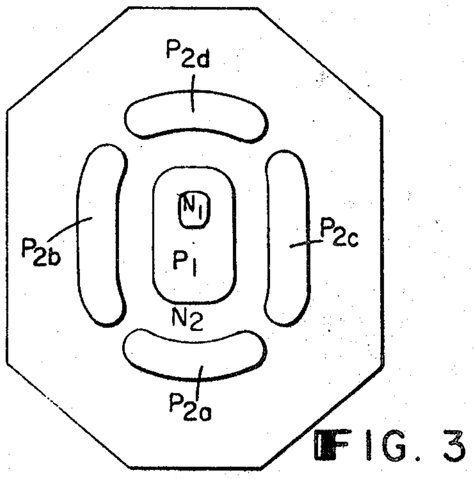
FIG. 3 is a representation of the upper surface of the semiconductor body of the device of FIG. 1 illustrating the pattern of conductivity type regions in the body.

The device 10 according to the invention as illustrated in FIGS. 1, 2, and 3 includes a body of single crystal silicon 11 coated with an adherent layer of silicon oxide 12 and contact members 13, 14, 15, 16, and 17 making ohmic connection to surface areas of the underlying silicon. As illustrated in the figures the bulk or major portion of the body, designated as $N_2$, is of N-type silicon. P-type regions $P_1$, $P_{2a}$, $P_{2b}$, $P_{2c}$, and $P_{2d}$ are formed by diffusion of appropriate conductivity type imparting material into portions of the N-type body. A portion of the $P_1$ region $N_1$ is reconverted to N-type conductivity by diffusion of an appropriate conductivity type imparting material. Contact members 13, 14, and 15 which are of the so-called beam-lead type make ohmic contact to surface areas or regions $N_1$, $P_1$, and $P_{2a}$, respectively. These members include portions which overlie and adhere to the oxide layer and extend outward beyond the periphery of the body to enable electrical connections to be made to the device. Conductive members 16 and 17 make contact to the surface areas of regions $P_{2b}$ and $P_{2c}$.

The device as illustrated may be produced by the selective diffusion of conductivity type imparting materials into a slice of N-type silicon in accordance with known techniques. As is well known, a large number of devices are produced simultaneously in a single slice. An adherent protective silicon oxide coating is formed on the flat upper surface of the N-type silicon slice. Openings are made in the oxide coating by photoresist masking and etching techniques to expose areas of the surface of the slice. Boron is diffused through these openings to convert underlying regions $P_1$, $P_{2a}$, $P_{2b}$, $P_{2c}$, and $P_{2d}$ to P-type conductivity. The oxide coating is reconstituted and an opening made therein to expose a surface area within the surface area of the $P_1$ region. Phosphorus is diffused through this opening to reconvert the underlying portion of the diffused P-type region to N-type conductivity thereby forming the $N_1$ region.

Openings are then formed in the oxide coating to expose portions of the surface areas of the double-diffused N-type region $N_1$ and the diffused P-type regions $P_1$, $P_{2a}$, $P_{2b}$, and $P_{2c}$. Supporting metal contact members 13, 14, 15, 16, and 17 which make ohmic contact to the surface areas at the openings are then fabricated as by employing the method disclosed and claimed in application Ser. No. 498,039, filed Oct. 19, 1965, now Patent No. 3,421,985 by Allen G. Baker and Robert C. Ingraham entitled, "Method of Producing Semiconductor Devices Having Connecting Leads Attached Thereto," and assigned to the assignee of the present invention.

The slice is divided into individual devices as by first etching away silicon oxide to leave a pattern of oxide for each device as illustrated in FIG. 1. Then the underside of the wafer is masked and silicon material is etched away to divide the slice into individual devices as shown in FIG. 1.

Each device includes an N-type bulk region $N_2$ of uniform resistivity. Inset centrally of the $N_2$ region is a diffused P-type region $P_1$, and inset into the $P_1$ region is a double-diffused N-type region $N_1$. Also inset in the $N_2$ region as illustrated in FIG. 3 are four diffused P-type regions $P_{2a}$, $P_{2b}$, $P_{2c}$, and $P_{2d}$. The four $P_2$ regions are disposed about different portions of the $P_1$ region and are each equally distant from the $P_1$ region. They are arranged so that the shortest distance between adjacent $P_2$ regions is less than the distance between the $P_2$ regions and the $P_1$ region.

Contact members 13, 14, and 15 make ohmic contact to the $N_1$, $P_1$, and $P_{2a}$ regions, respectively, at openings in the oxide coating 12. These members overlie and adhere to the oxide coating 12 and extend beyond the edges of the coating to permit electrical connections to be made when the device is mounted on a circuit board or in an enclosure. Contact members 16 and 17 and portion 15*a* of the contact member 15 are in ohmic contact with surface areas of the $P_{2b}$, $P_{2c}$, and $P_{2a}$, regions, respectively. These conductive members prevent voltage differentials from occurring along the length of the regions which they contact.

Figure 4:
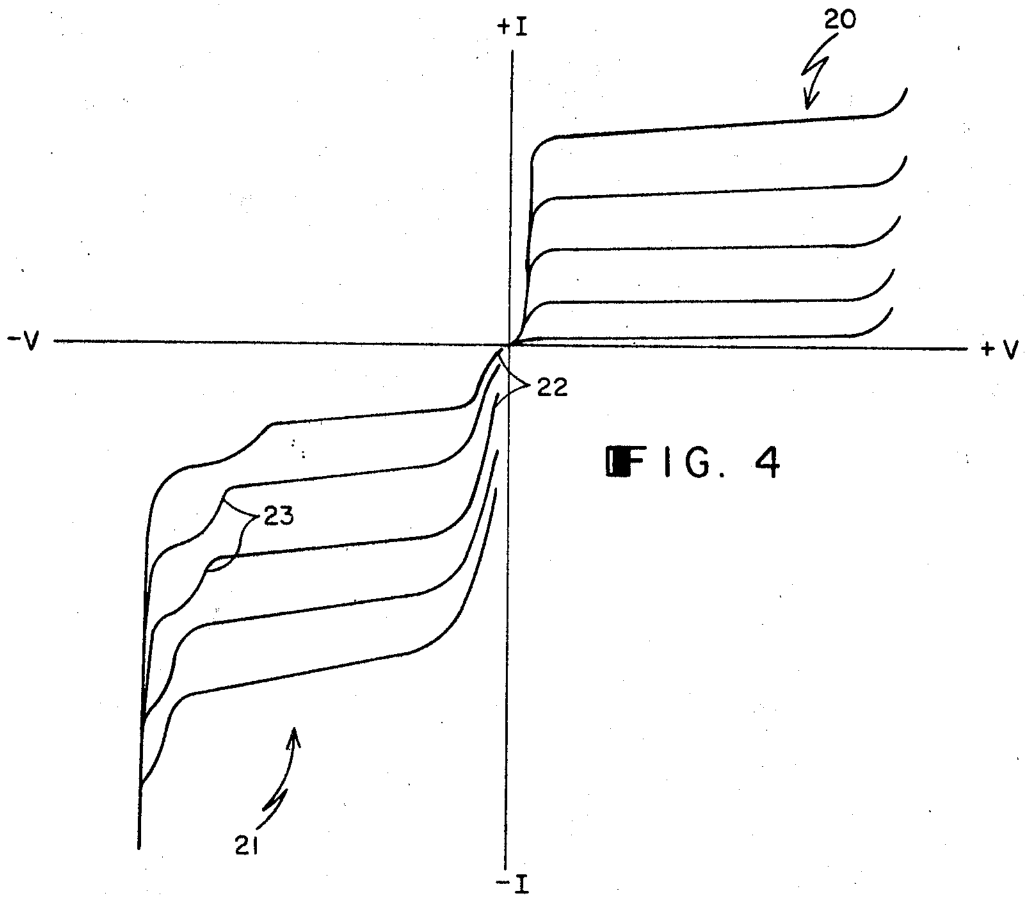
FIG. 4 is a graph of the current-voltage characteristics of the device.

FIG. 4 illustrates typical current-voltage characteristics of the device of FIGS. 1, 2, and 3. In the graph the negative current scale is exaggerated ten times with respect to the positive current scale. When the device is operated in the forward biased condition, a negative voltage is applied to the $N_1$ region or cathode and a positive voltage is applied to the $P_{2a}$ region or anode. The curves 20 show the variations of current flow with applied voltage for different values of positive voltage applied to the $P_1$ region or gate. Under forward biasing conditions and $P_{2b}$, $P_{2c}$, and $P_{2d}$ regions do not take part in the device operation and the $P_{2a}$ region is the effective $P_2$ region or anode. Thus, the emitter region of the $P_2$–$N_2$–$P_1$ transistor section is small, thereby contributing to low current amplification for the transistor section and high breakover voltage for the device.

Curves 21 illustrate the current-voltage relationships for the device under reverse bias conditions with a positive voltage applied to the $N_1$ region and a negative voltage applied to the $P_{2a}$ region. The positive gate voltage applied to the $P_1$ region continues to forward bias the $P_1$–$N_1$ junction. Under these biasing conditions the $P_{2a}$ region functions as the collector of the $P_2$–$N_2$–$P_1$ transistor section and the $P_1$ region functions as the emitter. When the reverse voltage across the device is low, the $P_2$–$N_1$ junction is small; and, therefore, the leakage current and junction capacitance are low. However, the current amplification of the device is also very low.

As increasing reverse voltage is applied across the device, the space charge region or depletion layer surrounding the $P_{2a}$ region expands, in effect, increasing the $P_2$ region. At a certain critical voltage the space charge region reaches the $P_{2b}$ and $P_{2c}$ regions. This occurrence is known as punchthrough. When punchthrough occurs, the $P_{2b}$ and $P_{2c}$ regions and their space charge regions become part of the reverse biased $P_2$ region. Thus, the $P_2$ region becomes disposed about a much larger portion of the $P_1$ region and its ability to collect charge carriers emitted into the $N_2$ region across the $P_1$-$P_2$ junction is greatly increased. As indicated by the point 22 on the current-voltage curves 21 when punchthrough occurs, the current amplification of the device increases.

Further increase in the reverse voltage between the anode and cathode of the device increases the space charge region of the $P_{2b}$ and $P_{2c}$ segments until punchthrough occurs to the $P_{2d}$ region. At this voltage the $P_{2d}$ region also becomes part of the $P_2$ region of the device, and the $P_2$ region completely encircles the $P_1$ region further increasing the collection efficiency of the $P_2$ region. As indicated at point 23 in the characteristic curves 21 the current amplification of the device increases. Although the contact members 16 and 17 prevent voltage drops from occurring along the major portions of the lengths of the $P_{2b}$ and $P_{2c}$ regions, some voltage drop does occur across the outer portions which are of higher resistivity; and therefore, an increase in voltage is required to obtain punchthrough to the $P_{2d}$ region even though spacing between the adjacent $P_2$ regions is the same.

FIG. 5 is a circuit diagram illustrating operation of the device 10 according to the invention connected in series with a high voltage alternating current source 25 and a load 26. Appropriate D.C. bias voltage is applied to the gate by a suitable source 27. The circuit operates in accordance with the characteristic curves of the device as illustrated in FIG. 4. As previously explained the device provides current amplification when reverse biased as well as when forward biased. That is, the characteristics of the device are more symmetrical than those of prior art devices.

Figure 6:
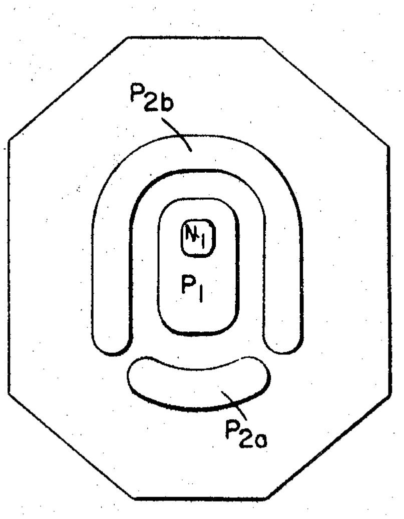
FIG. 6 is a representation similar to that of FIG. 3 illustrating the pattern of conductivity type regions in a modification of the device according to the invention.

FIG. 6 is a representation of the upper surface of a modified device according to the invention illustrating certain variations from the first embodiment. The device shown includes only one auxiliary anode region $P_{2b}$. In addition the $P_{2a}$ and $P_{2b}$ regions are arranged with the $P_{2b}$ region disposed closer to the $P_1$ region.

Under forward biasing conditions the device operates in the same manner as the device of FIGS. 1, 2, and 3 with only the $P_{2a}$ region active as the anode. Under reverse biasing conditions when punchthrough occurs, the $P_2$ region expands to include $P_{2a}$ and $P_{2b}$ and the space charge regions between them. As explained previously the increased $P_2$-$N_2$ junction area completely encircling the $P_1$ region increases the current amplification of the device. In addition, since the $P_{2b}$ region is closer to the $P_1$ region, the basewidth of the $P_2$-$N_2$-$P_1$ transistor section is reduced thereby further increasing the current amplification capability of that transistor section. The $P_{2b}$ region is spaced sufficiently from the $P_1$ region so that when maximum operating voltage is applied across the device, the space charge regions of the $P_{2a}$ and $P_{2b}$ regions do not touch the $P_1$ region.

A typical device according to the embodiment of FIGS. 1, 2, and 3 was fabricated of a slice of single crystal N-type silicon approximately 7 mils thick doped with arsenic to provide a uniform resistivity of approximately 20 ohm-centimeters. Boron was diffused through openings in an oxide coating on the flat upper surface of the N-type slice to produce P-type regions $P_1$, $P_{2a}$, $P_{2b}$, $P_{2c}$, and $P_{2d}$ of graded resistivity for each device. Phosphorus was then diffused through an opening in the reconstituted oxide coating to produce a double-diffused $N_1$ region of graded resistivity inset in the $P_1$ region.

After the diffusion steps the resulting $P_1$ region was approximately 4 mils by 7 mils with the corners slightly rounded. The $P_1$ region extended into the $N_2$ region constituting the bulk of the body to a depth of about 1 mil. The outer 1 mil of the region at the surface was formed by diffusion taking place under the oxide coating from the opening in the coating. Each of the other P-type regions $P_{2a}$, $P_{2b}$, $P_{2c}$, and $P_{2d}$ was similarly formed during the same diffusion step and was, therefore, 1 mil thick. The junctions of these regions with the $N_2$ region were approximately 2 mils from the $P_1$-$N_2$ junction. The $P_{2a}$ and $P_{2d}$ regions were each approximately 6 mils long and 2 mils wide. The $P_{2b}$ and $P_{2c}$ regions were each approximately 8 mils long and 2 mils wide. The configurations of these regions followed the pattern of the $P_1$-$N_2$ junction so that the $P_2$-$N_2$ junctions were equidistant from the $P_1$-$N_2$ junction. Each of the $P_2$ regions was spaced from the adjacent $P_2$ regions by about ½ mil.

The resulting $N_1$ region was approximately 2 mils square and extended to a depth of about .15 mil into the $P_1$ region. It was spaced from the $P_1$-$N_2$ junction by slightly less than 1 mil on three sides. As is well understood the diffused regions were of graded resistivity. That is, the resistivity of each region increased with distance from the surface area which was exposed to the diffusion material.

Conductive contact members 13, 14, 15, 16, and 17 were then formed by the method disclosed and claimed in the aforementioned application of Baker and Ingraham.

Contact members 13 and 14 made ohmic contact to exposed portions of the surface areas of the $N_1$ and $P_1$ regions, respectively. Contact members 16, 17 and the portion 15*a* made ohmic contact to the $P_{2b}$, $P_{2c}$, and $P_{2a}$ regions, respectively, for a large portion of their length in order to eliminate voltage differences along the length of each of these regions.

The slice was divided into individual devices by first etching away silicon oxide to leave a coating of oxide for each device in the pattern as shown in FIG. 1. Silicon was etched away from the undersurface of the slice to separate the individual devices as illustrated in FIG. 1. The portion of the silicon oxide coating extending outward beyond the resulting silicon die provided additional high voltage insulation between the overhanging contact members 13, 14, and 15 and the silicon body.

These devices were operated in circuits of the general nature of that illustrated in FIG. 5 with an A.C. source 25 providing a peak-to-peak voltage of 400 volts. The breakover voltage of the device was in excess of 400 volts. The current-voltage characteristics of the device were generally as represented by the curves in FIG. 4. Thus, the device was able to provide current amplification in driving a load during both halves of each cycle of the applied A.C. energy.

While there has been shown and described what are considered preferred embodiments of the present invention, it will be obvious to those skilled in the art that various changes and modifications may be made therein without departing from the invention.

What is claimed is:

1. A semiconductor device comprising
a body of semiconductor material;
a first zone of said body being of one conductivity type;
a first ohmic connection to said first zone;
a second zone of said body being of the opposite conductivity type and lying intermediate said first zone and the remainder of said body, said second zone being contiguous said first zone and forming a first P-N junction therewith;
a second ohmic connection to said second zone;
a third zone of said body being of the one conductivity type and lying intermediate the first and second zones and the remainder of said body, said third zone being contiguous said second zone and forming a second P-N junction therewith;
a fourth zone of said body being of the opposite conductivity type, said fourth zone being contiguous said third zone and forming a third P-N junction therewith, and said fourth zone being disposed about a first portion of said second zone;
a third ohmic connection to said fourth zone; and
a fifth zone of said body being of the opposite conductivity type, said fifth zone being contiguous said third zone and forming a fourth P-N junction therewith, and said fifth zone being disposed about a second portion of said second zone different from said first portion;
the shortest distance between the third P-N junction and the fourth P-N junction being less than the shortest distance between the third P-N junction and the second P-N junction and less than the shortest distance between the fourth P-N junction and the second P-N junction whereby the space charge region of the fourth zone may extend to the fifth zone while remaining spaced from the second zone and whereby the region of the body included by the fourth zone, the fifth zone, and the space charge region of the fourth zone when the space charge region extends to the fifth zone is disposed about a larger portion of the second zone than said first portion.

2. A semiconductor device comprising
a body of semiconductor material;
a first zone of the body being of one conductivity type and having a surface area in a surface of the body;

a first ohmic connection to the surface area of the first zone;

a second zone of the body being of the opposite conductivity type and lying intermediate the first zone and the remainder of the body, said second zone being contiguous said first zone and forming a first P-N junction therewith and having a surface area in said surface of the body encircling the surface area of the first zone;

a second ohmic connection to the surface area of the second zone;

a third zone of the body being of the one conductivity type and lying intermediate the first and second zones and the remainder of the body, said third zone being contiguous said second zone and forming a second P-N junction therewith and having a surface area in said surface of the body encircling the surface area of the second zone;

a fourth zone of the body being of the opposite conductivity type, said fourth zone being contiguous the third zone and forming a third P-N junction therewith and having a surface area in said surface of the body encircled by the surface area of the third zone, and said fourth zone being disposed about a first portion of said second zone;

a third ohmic connection to the surface area of the fourth zone; and a fifth zone of the body being of the opposite conductivity type, said fifth zone being contiguous the third zone and forming a fourth P-N junction therewith and having a surface area in said surface of the body encircled by the surface area of the third zone, and said fifth zone being disposed about a second portion of said second zone different from said first portion;

the shortest distance between the third P-N junction and the fourth P-N junction being less than the shortest distance between the third P-N junction and the second P-N junction and less than the shortest distance between the fourth P-N junction and the second P-N junction whereby the space charge region of the fourth zone may extend to the fifth zone while remaining spaced from the second zone and whereby the region of the body included by the fourth zone, the fifth zone, and the space charge region of the fourth zone when the space charge region extends to the fifth zone is disposed about a larger portion of the second zone than said first portion.

3. A semiconductor device in accordance with claim 2 wherein the second zone is completely encircled at the surface by the fourth zone, the fifth zone, and the portions of the third zone occupied by the space charge region of the fourth zone when punchthrough occurs from the fourth zone to the fifth zone.

4. A semiconductor device in accordance with claim 2 wherein the shortest distance between the fourth P-N junction and the second P-N junction is less than the shortest distance between the third P-N junction and the second P-N junction.

5. A semiconductor device comprising a body of semiconductor material;

a first zone of the body being of one conductivity type and having a surface area in a surface of the body;

a first ohmic connection to the surface area of the first zone;

a second zone of the body being of the opposite conductivity type and lying intermediate the first zone and the remainder of the body, said second zone being contiguous said first zone and forming a first P-N junction therewith and having a surface area in said surface of the body encircling the surface area of the first zone;

a second ohmic connection to the surface area of the second zone;

a third zone of the body being of the one conductivity type and lying intermediate the first and second zones and the remainder of the body, said third zone being contiguous said second zone and forming a second P-N junction therewith and having a surface area in said surface of the body encircling the surface area of the second zone;

a plurality of zones of the body being of the opposite conductivity type, each being contiguous the third zone and forming a P-N junction therewith and having a surface area in said surface of the body encircled by the surface area of the third zone; and a third ohmic connection to the surface area of one of the zones of said plurality of zones;

said plurality of zones being arranged around the second zone with each zone of said plurality of zones disposed about a different portion of said second zone, the shortest distance between adjacent zones of said plurality of zones being less than the shortest distance between the zones of said plurality of zones and the second zone whereby the second zone is completely encircled at the surface by the plurality of zones and the portions of the third zone occupied by the space charge regions of the plurality of zones when punch-through occurs between the zones.

6. A semiconductor device in accordance with claim 5 wherein said second zone is located centrally of said plurality of zones equidistant from each of the zones of said plurality.

7. An electrical circuit comprising the semiconductor device of claim 1 and further including a source of alternating voltage and a load means serially connected between the first and third ohmic connections of said device, said source of alternating voltage being operable to reverse bias the fourth P-N junction of the device sufficiently to cause the space charge region of the fourth P-N junction to expand to said fifth zone whereby the fourth and fifth zones effectively act as a single reverse biased region to collect minority charge carriers emitted from the second zone into the third zone.

References Cited

UNITED STATES PATENTS 3,391,287 7/1968 Kao et al. ---------- 317—235

FOREIGN PATENTS 245,625 3/1966 Austria.

JOHN W. HUCKERT, Primary Examiner

J. D. CRAIG, Assistant Examiner

U.S. Cl. X.R.

317—235